(12) United States Patent
Nakamura et al.

(10) Patent No.: US 11,101,816 B2
(45) Date of Patent: Aug. 24, 2021

(54) A/D CONVERTER

(71) Applicant: DENSO CORPORATION, Kariya (JP)

(72) Inventors: Kunihiko Nakamura, Kariya (JP); Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/098,711

(22) Filed: Nov. 16, 2020

(65) Prior Publication Data
US 2021/0159911 A1   May 27, 2021

(30) Foreign Application Priority Data
Nov. 21, 2019 (JP) .............................. JP2019-210484

(51) Int. Cl.
*H03M 3/00* (2006.01)
*G06G 7/186* (2006.01)
*H03M 1/46* (2006.01)
*H03M 1/36* (2006.01)

(52) U.S. Cl.
CPC ............ *H03M 3/424* (2013.01); *G06G 7/186* (2013.01); *H03M 1/362* (2013.01); *H03M 1/466* (2013.01); *H03M 3/354* (2013.01); *H03M 3/464* (2013.01); *H03M 3/496* (2013.01)

(58) Field of Classification Search
CPC ...... H03M 3/424; H03M 3/354; H03M 1/362; H03M 1/466; H03M 3/496; H03M 3/464; G06G 7/186
USPC .................................................. 341/143, 155
See application file for complete search history.

(56) References Cited

U.S. PATENT DOCUMENTS

| 7,388,533 | B2 * | 6/2008 | Kim ...................... H03M 3/352 341/143 |
| 9,281,837 | B2 * | 3/2016 | Nezuka ................. H03M 3/368 |
| 2019/0363731 | A1 | 11/2019 | Nezuka | |

* cited by examiner

*Primary Examiner* — Khai M Nguyen
(74) *Attorney, Agent, or Firm* — Posz Law Group, PLC

(57) ABSTRACT

An A/D converter includes: a sampler that includes a sampling capacitor and samples an input signal; a D/A converter that selectively outputs an analog voltage; an integrator that integrates an input from the sampler and an input from the D/A converter; Multiple switches that include a first switch independently connecting the sampler to the integrator, a second switch independently connecting the D/A converter to the integrator, a third switch, and, a fourth switch, a quantizer that quantizes an output of the integrator; a control circuit that outputs a digital value based on an output of the quantizer, and a reference potential generation circuit that provides a second reference potential to an integrator side of the sampler through the third switch and provides a first reference potential to the integrator side of the D/A converter through the fourth switch.

8 Claims, 6 Drawing Sheets

A/D CONVERTER

CROSS REFERENCE TO RELATED APPLICATION

The present application claims the benefit of priority from Japanese Patent Application No. 2019-210484 filed on Nov. 21, 2019. The entire disclosure of the above application is incorporated herein by reference.

TECHNICAL FIELD

The present disclosure relates to an A/D converter.

BACKGROUND

There is an A/D converter, as a comparative example, in which a sampler and a D/A converter (hereinafter, also referred to as a DAC) are independently connected to an integrator.

SUMMARY

An A/D converter may include: a sampler that may include a sampling capacitor and sample an input signal; a D/A converter that may selectively output an analog voltage; an integrator that may integrate an input from the sampler and an input from the D/A converter; Multiple switches that may include a first switch independently connecting the sampler to the integrator, a second switch independently connecting the D/A converter to the integrator, a third switch, and, a fourth switch; a quantizer that quantizes an output of the integrator; a control circuit that outputs a digital value based on an output of the quantizer and a reference potential generation circuit that provides a second reference potential to an integrator side of the sampler through the third switch and provides a first reference potential to the integrator side of the D/A converter through the fourth switch.

BRIEF DESCRIPTION OF DRAWINGS

The above and other features and advantages of the present disclosure will become more apparent from the following detailed description made with reference to the accompanying drawings. In the drawings.

DETAILED DESCRIPTION

Figure 1:
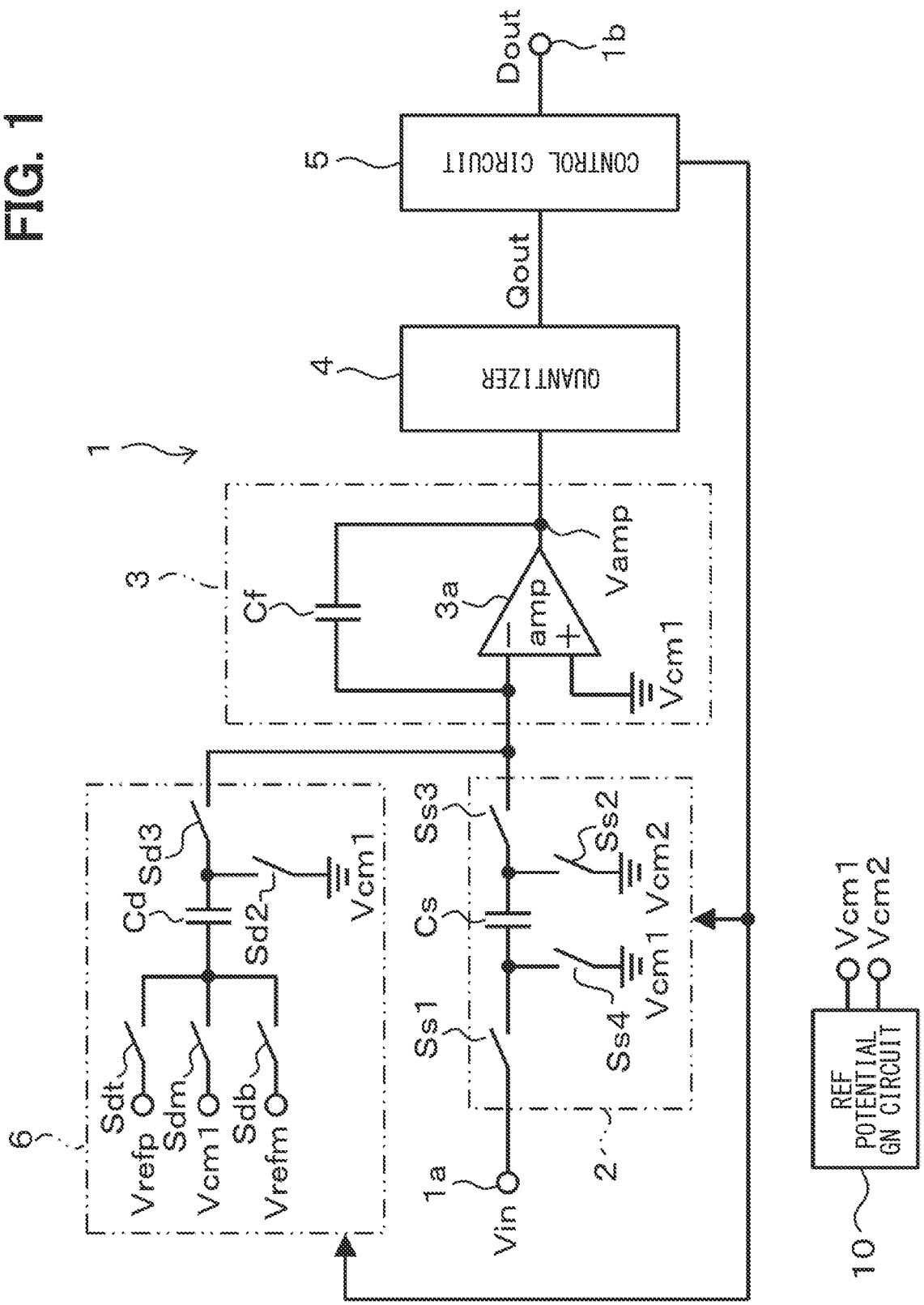
FIG. 1 is an electrical configuration diagram showing a first embodiment.

Among A/D converters, there is an A/D converter, as a comparative example, in which a sampler and a D/A converter (hereinafter, also referred to as a DAC) are independently connected to an integrator. Such an A/D converter can execute a sample/hold operation of an input signal and a DAC operation at independent timings. Therefore, the versatility is enhanced, and a high-performance A/D conversion process can be executed.

In this case, the sampler and the DAC can be independently operated. Thereby, when both circuits are connected to an analog ground as a reference potential and thereafter one of the circuits is turned off or when the circuits are turned off at the same time and the slight time difference occurs or the like, a reduction in a calculation accuracy may be caused as whole. As the result, the performance of the A/D converter may be deteriorated.

One example of the present disclosure provides an A/D converter capable of suppressing a reduction in a calculation accuracy even when a sampler and a DAC are independent.

According to one example embodiment, an A/D converter includes: a sampler that includes a sampling capacitor and samples an input signal; a D/A converter that selectively outputs an analog voltage in accordance with a control signal; an integrator that integrates an input from the sampler and an input from the D/A converter; Multiple switches that may include a first switch independently connecting the sampler to the integrator, a second switch independently connecting the D/A converter to the integrator, a third switch, and, a fourth switch; a quantizer that may quantize an output of the integrator; a control circuit that may output a digital value based on an output of the quantizer; and a reference potential generation circuit that may provide a second reference potential to an integrator side of the sampler through the third switch and provide a first reference potential to the integrator side of the D/A converter through the fourth switch.

The above configuration is employed since the inventors found, as a factor of an occurrence of the reduction and the deterioration, a potential fluctuation of a reference potential (analog ground). That is, the comparative example configuration in which the sampler and the DAC (D/A converter) are independent is designed so that each of switches connected to one reference potential are turned off at the same time on a timing chart. However, in an actual circuit operation, the switches are not turned off at the same time, and a slight delay occurs.

On the other hand, the same amplifier generates the reference potential. Therefore, in a case where such a delay occurs, when one of the switches is turned off, the other reference potential may fluctuate. Therefore, for example, in the operations of the sampler and the DAC, an operation of a case where only one of the switches is turned off is different from an operation of case where both of the switches are turned off in the DAC calculation amount. The performance as the A/D converter may be reduced.

According to one example of the present disclosure, even in such a case, a reference potential generation circuit independently generating a first reference potential and a second reference potential that are set to the same reference potential is provided so that, in the both operations, the reference potential fluctuation does not occur due to interference. Therefore, it may be possible to avoid the fluctuation of the reference potential due to switching of the switch and suppress reduction in the performance as the A/D converter.

First Embodiment

Hereinafter, a first embodiment to which a ΔΣ modulation type A/D converter is applied will be described with reference to FIGS. 1 to 3.

Figure 2:
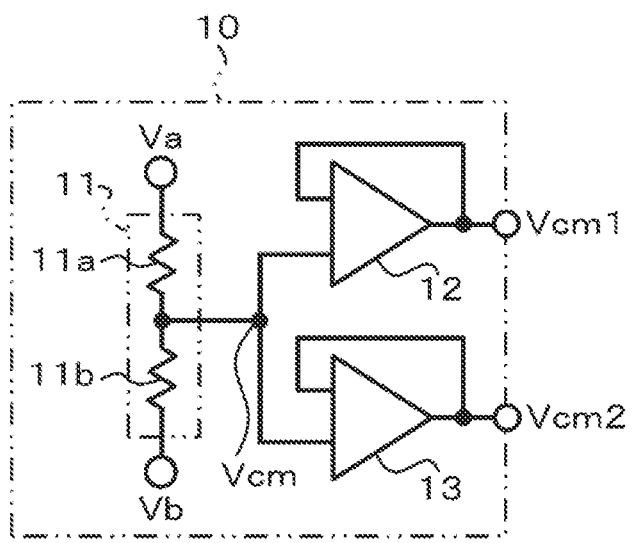
FIG. 2 is an electrical configuration diagram of a reference potential generation circuit.

In FIG. 1, the ΔΣ modulation type A/D converter (hereinafter, merely referred to as an "A/D converter") 1 includes an input terminal 1a of an analog input voltage Vin and an output terminal 1b of a digital signal output Dout. The A/D converter 1 includes a sampler 2, an integration circuit 3, a quantizer 4, a control circuit 5, and a D/A converter 5.

The sampler 2 includes a sampling capacitor Cs and four switches Ss1 to Ss4. The input terminal 1a is connected to the integration circuit 3 through the switch Ss1, the sampling capacitor Cs, and the switch Ss3 in series. An input side of the sampling capacitor Cs is connected to an analog ground Vcm1 as a first reference potential through a switch Ss4. An output side is connected to an analog ground Vcm2 as a second reference potential through a switch Ss2. On-off operations of the four switches Ss1 to Ss4 are controlled by the control circuit 5. The potentials of the analog grounds Vcm1 and the Vcm2 are set to be same.

In this case, the control circuit 5 performs a sample operation and a hold operation. The control circuit 5 turns on the switches Ss1 and Ss2 and turns off the switches Ss3 and Ss4 in the sample operation. The control circuit 5 turns off the switches Ss1 and Ss2 and turns on the switches Ss3 and Ss4 in the hold operation.

The integration circuit 3 includes an amplifier 3a and an integration capacitor Cf. An inversion input terminal of the amplifier 3a is connected to the switch Ss3 of the sampler 2 and is connected to the output terminal through the integration capacitor Cf. A non-inversion input terminal of the amplifier 3a is connected to the analog ground Vcm1. The amplifier 3a outputs, as an analog output Vamp, a result of an integration process performed in accordance with an input from the sampler 2 and the D/A converter 6.

The quantizer 4 internally includes a comparator. The quantizer 4 receives the analog output Vamp output from the amplifier 3a of the integration circuit 3, compares the analog output Vamp with a threshold voltage, and outputs a determination result, that is, a quantization result Qout to the control circuit 5. The control circuit 5 outputs a control signal corresponding to the quantization result Qout to the D/A converter 6 described later, and outputs a ΔΣ modulation result Dout according to a result of integrating the quantization result Qout.

The D/A converter 6 includes a DAC capacitor Cd and five switches Sdt, Sdm, Sdb, Sd2 and Sd3. The D/A converter 6 also has three analog potentials Vrefp, Vcm1, and Vrefm as reference potentials. The reference potential Vcm1 is set to the analog ground as the reference potential. The Vrefp is set to a potential higher than the Vcm1. The Vrefp is set to a potential lower than the Vcm1.

When the reference potential Vcm1 is 0V, the Vrefp and Vrefm are set to satisfy an equation of Vrefp=−Vrefm, that is, absolute values are equal and polarities are opposite to each other. The switches Sdt, Sdm, and Sdb function as selection switches, and connect the Vrefp, the Vcm1, and the Vrefm to an input side of the DAC capacitor Cd.

An output side of the DAC capacitor Cd is connected to the analog ground Vcm1 through the switch Sd2, and connected to the inversion input terminal of the amplifier 3a of the integration circuit 3 through the switch Sd3. The on-off operations of the five switches Sdt, Sdm, Sdb, Sd2, and Sd3 are controlled by the control circuit 5.

In this case, the control circuit 5 performs the sample operation and the hold operation based on the control signal corresponding to the quantization result output from the quantizer 4. In the sample operation, the control circuit 5 turns on the switch Sd2 and turns on any one of the selection switches Sdt, Sdm, and Sdb. In the hold operation, the control circuit 5 turns off the switch Sd2 and turns on the switch Sd3, and turns on any one of the switches Sdt, Sdm, and Sdb.

A reference potential generation circuit 10 generates the reference voltages Vcm1 and Vcm2 as the analog grounds, that is, the reference potentials. As shown in FIG. 2, specifically, in the reference potential generation circuit 10, a voltage division circuit 11 including a series circuit of resistors 11a and 11b is connected between analog voltages Va and Vb. An output voltage Vcm is obtained from a common connection point of the resistors 11a and 11b, The output voltage Vcm generates the analog grounds Vcm1 and Vcm2 through two amplifiers 12 and 13. Since the analog grounds Vcm1 and Vcm2 pass through the amplifiers 12 and 13 respectively, the potential fluctuation on one side does not affect the potential on the other side, that is, there is no mutual interference. In the drawings, the reference potential generation circuit 10 may be also referred to as "REF POTENTIAL GN CIRCUIT".

Next, an operation of the above-mentioned configuration will be described with further reference to FIG. 3. In this configuration, a sample period and a hold period of the sampling capacitor Cs do not match a sample period and a hold period of the DAC capacitor Cd, and are set independently. The sampling and the holing in the sample period and the hold period are set to a period that matches a timing of a clock. The clock is shown by time points t0 to t4, as shown in FIG. 3.

Figure 3:
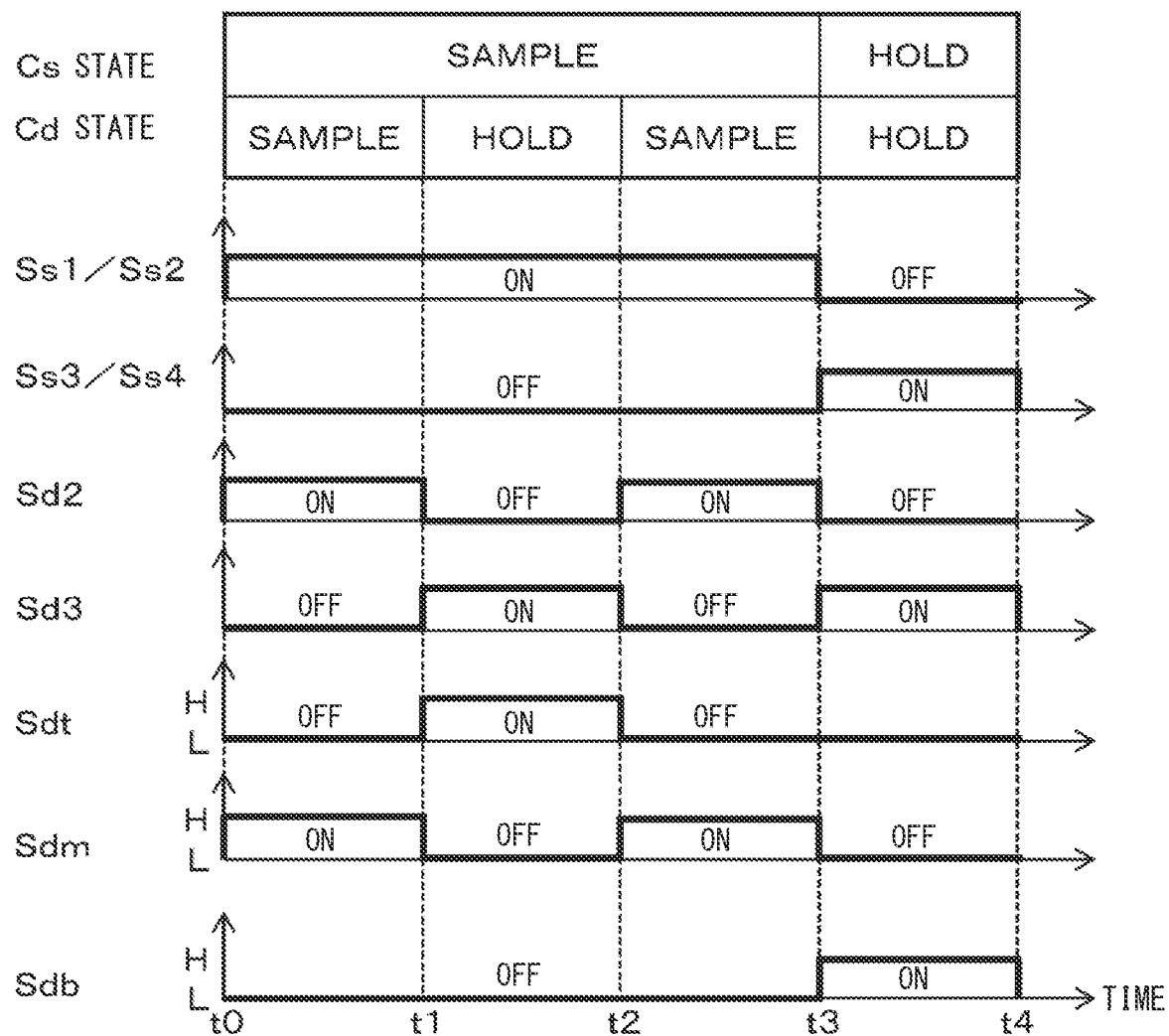
FIG. 3 is a timing chart.

FIG. 3 shows, as operation states of the sampling capacitor Cs and the DAC capacitor Cd, the sample period and the hold period. Further, FIG. 3 shows an on-off state of each switch corresponding to the sample period and the hold period.

As basic contents of A/D conversion process, the sample operation is performed to take the analog input voltage Vin input to the input terminal 1a into the sampling capacitor Cs in the sample period S (t0 to t3), and the hold operation is performed to transfer the charge based on the input signal Vin accumulated in the sampling capacitor Cs in the hold period H (t3 to t4) to the integration capacitor Cf. In the sampler 2, the above described sample operation and the above described hold operation are alternately performed.

At this time, in case of performing the sample operation to the sampling capacitor Cs, the control circuit 5 turns on the switches Ss1 and Ss2 and turns off the switches Ss3 and Ss4 at the time point t0 as shown in FIG. 3. As a result, the input side of the sampling capacitor Cs is connected to the input terminal 1a and the output side is connected to the analog ground Vcm2. Thus, the sampling capacitor Cs is charged by the analog input voltage Vin.

The control circuit 5 turns off the switches Ss1 and Ss2 at the time point t3, and turns on the switches Ss3 and Ss4 when the hold operation is performed. Thereby, the input side of the sampling capacitor Cs is connected to the analog ground Vcm1, and the output side is connected to the inversion input terminal of the amplifier 3a of the integration circuit 3. Thereby, the charges accumulated in the sampling capacitor Cs are transferred to the integration capacitor Cf.

On the other hand, the control circuit 5 alternately performs the sample operation and the hold operation on the DAC capacitor Cd for each clock, as shown in FIG. 3. At this time, in the sample operation in the sample period S (t0 to t1), the control circuit 5 turns on the switch Sd2 and holds the switch Sd3 in the off state at the time point t0.

At the same time, the control circuit 5 turns on one of the selection switches Sdt, Sdm, and Sdb. Thereby, the input side of the DAC capacitor Cd is connected to either one of Vrefp, Vrefm, and Vcm1, and the output side is connected to the analog ground Vcm1 The DAC capacitor Cd is charged by the potential of the connected voltage.

Here, for example, the selection switch Sdm is turned on, and the selection switches are held in the off state. Thereby, the voltage Vcm1 is applied to both ends of the DAC capacitor Cd.

In the hold operation performed in the hold period (t1 to t2), the control circuit 5 turns off the switch Sd2 and turns on the switch Sd3 at the time point t1. At the same time, the control circuit 5 turns on any one of the selection switches Sdt, Sdm, and Sdb. Thereby, the input side of the DAC capacitor Cd is connected to any one of Vrefp, Vrefm, and Vcm1, and the output side is connected to the inversion input terminal of the amplifier 3a of the integration circuit 3. Thereby, the charges accumulated in the DAC capacitor Cd are transferred to the integration capacitor Cf.

Here, for example, the selection switch Sdt is turned on and the selection switch Sdm is turned off, and the selection switch Sdb is hold in the off state. Thereby, the reference voltage Vrefp is applied to the input side of the DAC capacitor Cd, and the output side is connected to the inversion input terminal of the amplifier 3a.

At this time, the D/A converter 6 is enabled to transfer the charges corresponding to the analog potentials of multiple levels to the integration capacitor Cf by combining the three potentials Vrefp, Vrefm, and Vcm1 selected by the selection switches Sdt, Sdm, and Sdb in each of the sample period and the hold period. The quantizer 4 performs the quantization process at the time points t0, t2, and t4 of the clock, and outputs quantization data Qout to the control circuit 5.

When the operations in the sample period and the hold period are performed as described above, at the time point t1, the switch Sd2 of the D/A converter 6 is turned off and the analog around Vcm1 is disconnected. Then, the on state of the switch Ss2 of the sampler 2 is maintained, and the output side of the sampling capacitor Cs is connected to the analog ground Vcm2.

On the other hand, at the time point t3, the switch Sd2 of the D/A converter 6 is turned off, and the analog ground Vcm1 is disconnected. The switch Ss2 of the sampler 2 is also turned off and the analog ground Vcm2 is disconnected. Then, although the switches Sd2 and Ss2 are controlled to be turned off at the same time on the sequence, in the actual circuit operation, the switches are not turned off at the same time, and the slight difference may occur.

Therefore, in the comparative example, the potential of the common analog ground fluctuates when one of the switches is turned off. The potential fluctuation effect is applied through the other of the switches before it is turned off. A state where the reduction in the calculation accuracy or the like may occur.

In this embodiment, even when the difference in the off timing of the switch occurs, the analog grounds Vcm1 and Vcm2 are set to the different reference potential generations and therefore the effect of the voltage fluctuation in the one side cannot be applied to the other side. It may be possible to provide the reference potential as the stable analog ground. It may be possible to suppress the reduction in the overall performance.

According to such a present embodiment, the circuit 10 for applying the analog ground potential is placed. The analog grounds Vcm1 and Vcm2 for suppressing the voltage fluctuation due to the on-off operations of the switch are independently supplied. Therefore, even when the off timings of the switches Ss2 and Sd2 cause one reference potential to fluctuate, it may be possible to prevent the other reference potential from receiving the effect.

Thereby, in the sampler 2, even in a case where the analog ground Vcm2 fluctuates at switching from the sampling of the Vin to the hold, the potential (Vcm1) of the other analog ground is not affected. Since the sampling capacitor Cs and the DAC capacitor Cd can push out the charges at the analog ground potential Vcm1 that is the same potential during the hold, it may be possible to obtain conversion output with high accuracy.

In the embodiment described above, it may be possible to obtain the conversion output with higher accuracy by feeding back the quantization result multiple times per sampling cycle. In this case, when the quantization result is fed back multiple times, it may be possible to suppress a state where the calculation accuracy for each phase differs due to the error caused by the reference potential fluctuation during a phase in which only the Sd2 is turned off and a phase in which the Ss2 and the Sd2 are turned off at the same time. Therefore, it may be possible to improve the accuracy.

In the above embodiment, the switch Ss1 and the switch Ss2 of the sampler 2 are tuned on and off in the same phase and in the synchronized manner. However, the timings of turning on and off need not be completely the same but may be slightly different. The timings of turning on and off of the switches Ss3 and Ss4 may also be slightly different.

Further, the switch Ss1 and the switch Ss2, and the switch Ss3 and the switch Ss4 are operated to be turned on and off oppositely, that is, in the reversed manner, to each other. However, for example, the switch Ss1 and the switch Ss4 connected to one end of the sample capacitor Cs or the switch Ss2 and the switch Ss3 connected to the other end of the sampling capacitor Cs may be turned off simultaneously for a certain period at the time of transition between turning on and off. Similarly, although the switches Sd2 and Sd3 operate to be turned on and off oppositely, that is, in the reversed manner, both of these switches Sd2 and Sd3 may be turned off simultaneously for a certain period at the time of switching.

Second Embodiment

Figure 4:
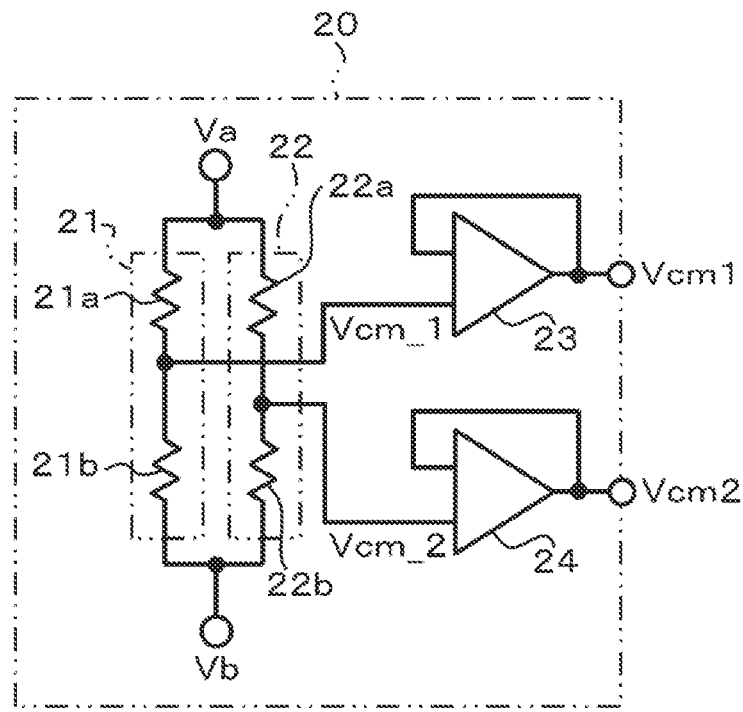
FIG. 4 is an electrical configuration diagram showing a second embodiment.

FIG. 4 shows a second embodiment. Differences from the first embodiment will be described below. The present embodiment includes a reference potential generation circuit 20 instead of the reference potential generation circuit 10 of the first embodiment.

As shown in FIG. 4, in the reference potential generation circuit 20, a voltage division circuit 21 including a series circuit of resistors 21a and 21b is connected between the analog voltages Va and Vb. A first output voltage Vcm_1 is obtained from a common connection point of the resistors 21a and 21b. A voltage division circuit 22 including a series circuit of resistors 22a and 22b is connected between the analog voltages Va and Vb. A second output voltage Vcm_2 is obtained from a common connection point of the resistors 22a and 22b. The first output voltage Vcm_1 and the second output voltage Vcm_2 generate the analog grounds Vcm1 and Vcm2 respectively through amplifiers 23 and 24.

According to such a second embodiment, since the reference potential generation circuit 20 has the configuration described above, it may be possible to suppress a voltage fluctuation transmitted through a parasitic capacitance between the analog grounds Vcm1 and Vcm2 as the reference potentials, it may be possible to further improve the accuracy by performing the similar operation to that of the first embodiment.

Third Embodiment

Figure 5:
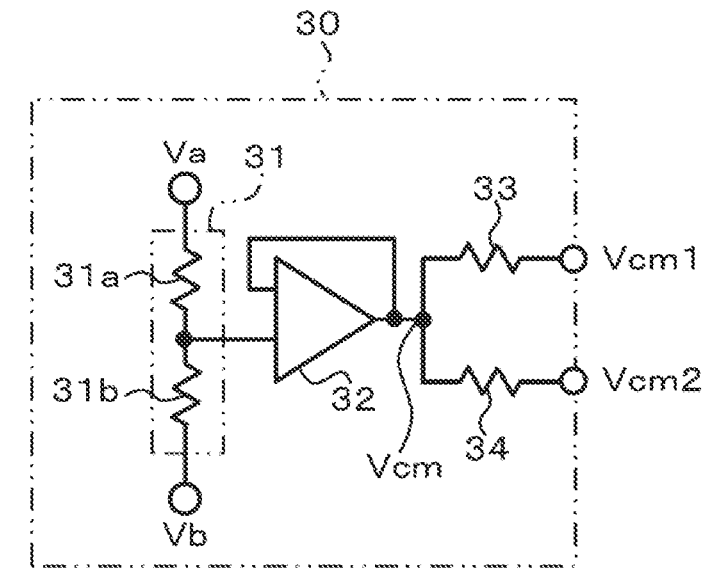
FIG. 5 is an electrical configuration diagram showing a third embodiment.

FIG. 5 shows a third embodiment. Differences from the first embodiment will be described below. The present embodiment includes a reference potential generation circuit 30 instead of the reference potential generation circuit 10 of the first embodiment.

As shown in FIG. 5, in the reference potential generation circuit 30, a voltage division circuit 31 including a series circuit of resistors 31a and 31b is connected between the analog voltages Va and Vb. The output voltage Vcm is obtained from a common connection point of the resistors 31a and 31b. The output voltage Vcm is output through an amplifier 32. Thereafter, the analog grounds Vcm1 and Vcm2 are output through resistors 33 and 34 respectively.

According to such a third embodiment, since the reference potential generation circuit 30 has the configuration described above, it may be possible the actual interference in a state where the reference potential generation circuit 30 includes one simple amplifier. It may be possible to obtain the similar operation effect to that of the first embodiment. The resistors 33 and 34 may be wiring resistors.

Fourth Embodiment

Figure 6:
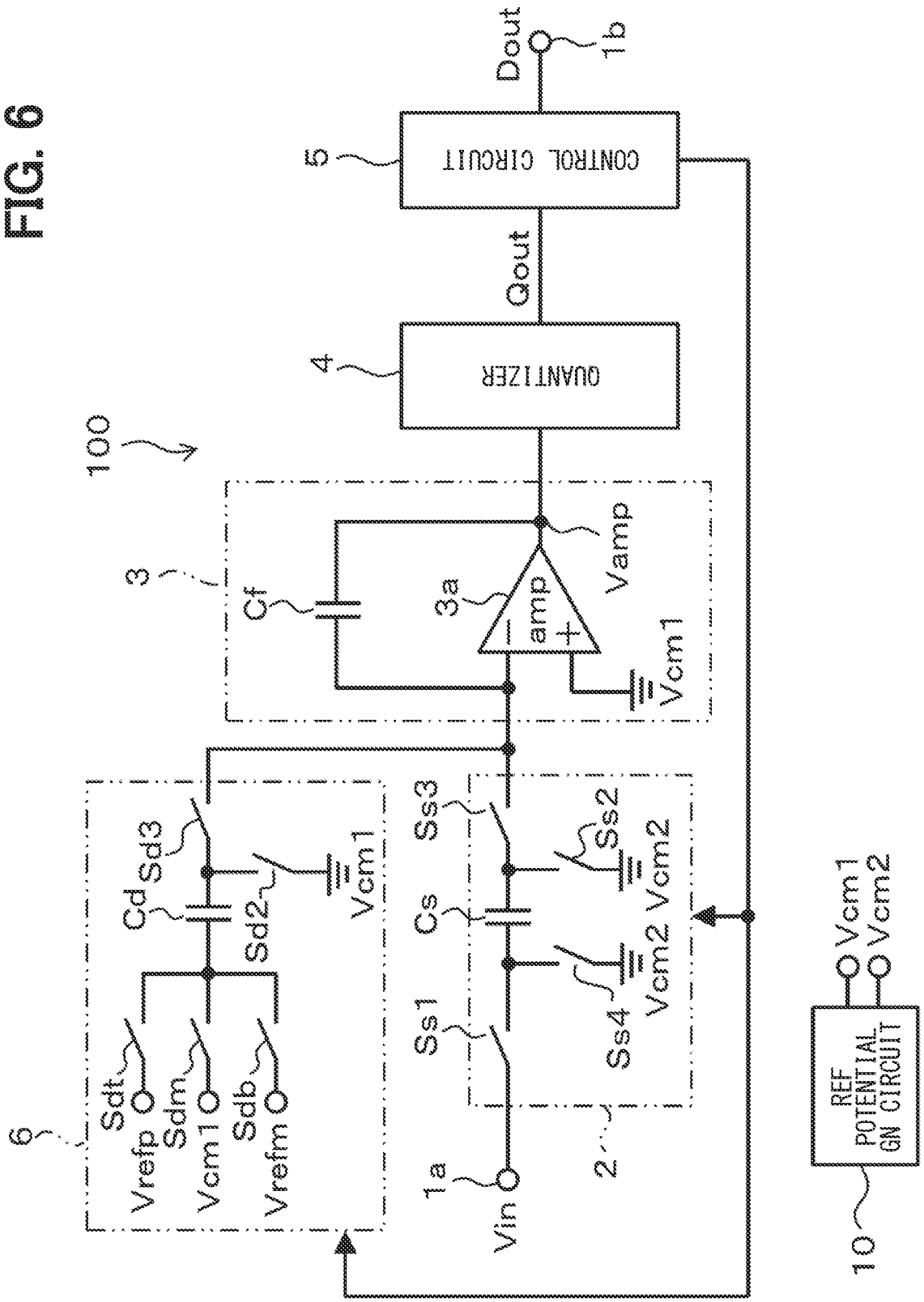
FIG. 6 is an electrical configuration diagram showing a fourth embodiment.

FIG. 6 shows a fourth embodiment. Differences from the first embodiment will be described below. In the sampler 2 of an A/D converter 100 of the present embodiment, the output side and the input side of the sampling capacitor Cs are connected to the Vcm2 as the analog ground through the switches Ss2 and Ss4 respectively.

In the configuration described above, the analog grounds Vcm1 and Vcm2 are generated from the reference potential generation circuit 10. The analog grounds Vcm1 and Vcm2 can be generated by the reference potential generation circuit 20 of the second embodiment and the reference potential generation circuit 30 of the third embodiment, According to the fourth embodiment of such a configuration, it may be possible to obtain the similar operation effect to that of the first embodiment.

Furthermore, according to this fourth embodiment, it may be possible to the following effect in addition to the effect described above. That is, in the operation described above, one of the switches Ss2 and Ss4 is always held in the on state. Therefore, the analog ground Vcm2 is always connected to one terminal of the sampling capacitor Cs.

Thereby, it may be possible to avoid the analog around Vcm2 from becoming unloaded, and keep the stable state. In the sample/hold operation of the sampler 2, it may be possible to perform an operation completed by only the analog ground Vcm2. There is no dependence on the input voltage Vin.

Fifth Embodiment

Figure 7:
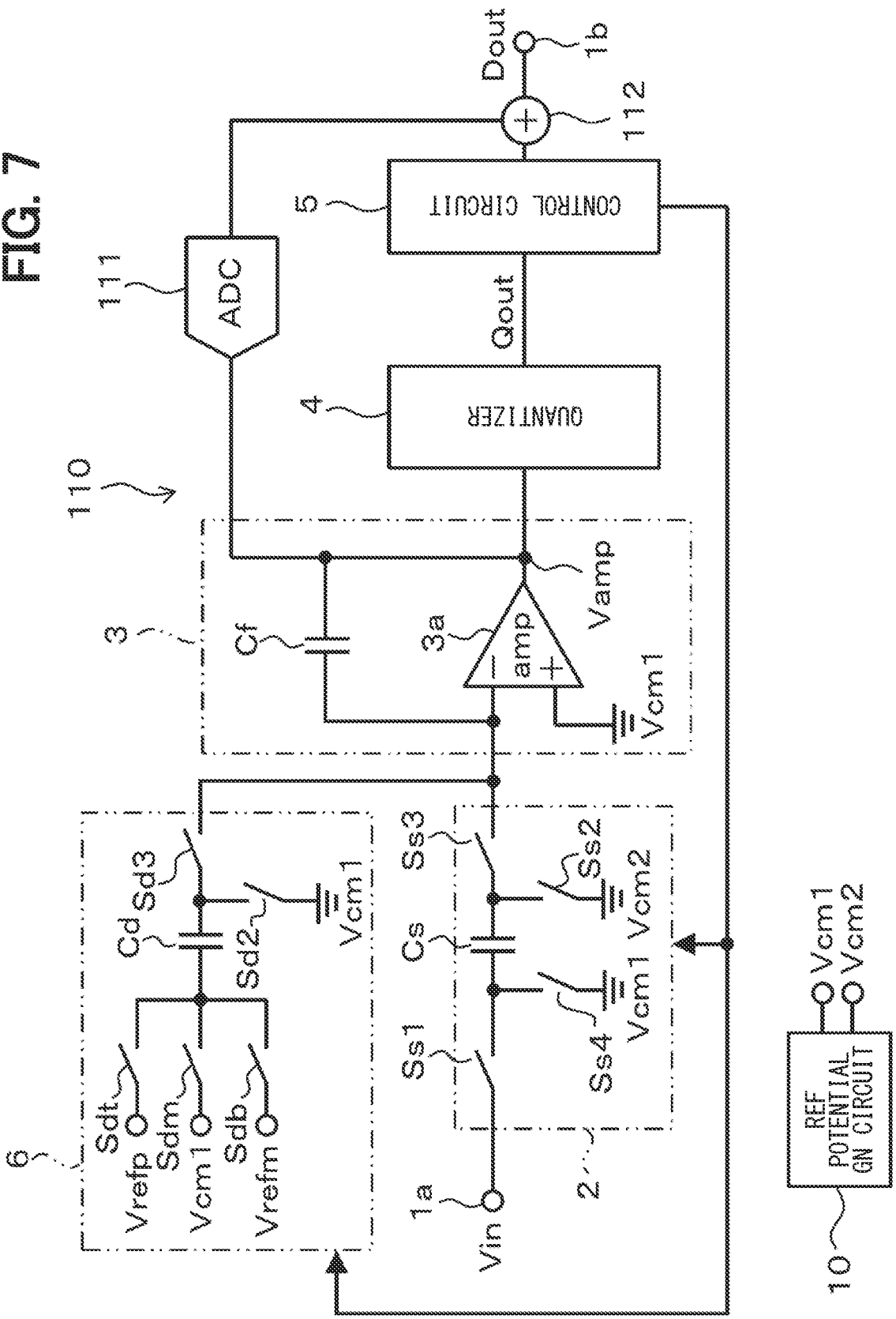
FIG. 7 is an electrical configuration diagram showing a fifth embodiment.

FIG. 7 shows a fifth embodiment. Differences from the first embodiment will be described below. An A/D converter 110 of the present embodiment shows an example applied to a hybrid type A/D converter including a sub A/D converter 111 in addition to the configuration in FIG. 1.

As shown in FIG. 7, in this embodiment, the sub A/D converter 111 is placed in parallel with the quantizer 4 in the side of the output terminal of the amplifier 3a of the integration circuit 3. As shown in the following equation, an adder 112 adds a digital output Mout of the control circuit 5 to a digital output Lout output from the sub A/D converter 111, the addition result is output as a Dout.

Dout=Mout+Lout

The sub A/D converter 111 performs a part of the quantization in the process of the A/D conversion by the quantizer 4. The output of the amplifier 3a is taken and input to, as the digital output Lout, the adder 112 together with the digital output Mout of the control circuit 5. The adder 112 adds the Mout output from the control circuit 5 and the digital output Lout output from the sub A/D converter 111, and obtains the final digital output Dout. The quantizer 4 and the control circuit 5 generate a high bit digital value. The sub A/D converter 111 generates a remaining low bit digital value.

As the sub A/D converter 111, a generally known A/D converter can be employed. For example, a cyclic type A/D converter can be employed.

Even when the sub A/D converter is applied to the hybrid type A/D converter, it may be possible to the similar operation effect to that of the first embodiment.

Other Embodiments

The present disclosure should not be limited to the embodiments described above, and various embodiments may further be implemented without departing from the scope of the present invention. For example, the embodiments may be modified or expanded as described below.

In each of the embodiments described above, the circuits 10, 20, and 30 or the like are used. However, a different circuit configuration may generate the independent reference potentials Vcm1 and Vcm2. As the reference potential generation circuits 10, 20, and 30, it may be possible to selectively use an appropriate reference potential generation circuit depending on a relation between the accuracy required by the circuit and the circuit configuration.

The first reference potential Vcm1 and the second reference potential Vcm2 are set to the ground level of the same potential as the analog ground. However, the first reference potential Vcm1 and the second reference potential Vcm2 can be set to the same potential that is a predetermined potential other than the ground level.

In the embodiments described above, the number of performed cycles in the sample period and the hold period of the D/A converter 6 are set to two in correspondence to the sample period of the sampler 2. However, the number of performed cycles may be set to three or more.

Although the present disclosure has been described in accordance with the embodiments, it is understood that the present disclosure is not limited to the embodiments and structures disclosed therein. The present disclosure encompasses various modifications and variations within the scope of equivalents. In addition, various combinations and forms, and further, other combinations and forms including only one element, or more or less than these elements are also within the sprit and the scope of the present disclosure.

The invention claimed is:
1. An A/D converter comprising:
 a sampler that includes a sampling capacitor and is configured to sample an input signal;
 a D/A converter configured to selectively output an analog voltage in accordance with a control signal;
 an integrator configured to integrate an input from the sampler and an input from the D/A converter;

a plurality of switches that includes a first switch independently connecting the sampler to the integrator, a second switch independently connecting the D/A convertor to the integrator, a third switch, and, a fourth switch;

a quantizer configured to quantize an output of the integrator;

a control circuit configured to output a digital value based on an output of the quantizer; and a reference potential generation circuit configured to provide a second reference potential to an integrator side of the sampler through the third switch and provide a first reference potential to the integrator side of the D/A converter through the fourth switch.

2. The A/D converter according to claim 1, wherein:

the plurality of switches further include a fifth switch; and the reference potential generation circuit is configured to provide the first reference potential to an input side of the sampler through the fifth switch.

3. The A/D converter according to claim 1, wherein:

the reference potential generation circuit includes a voltage division circuit, a first amplifier for providing the first reference potential, and a second amplifier for providing the second reference potential.

4. The A/D converter according to claim 1, wherein:

the reference potential generation circuit includes a first voltage division circuit for providing the first reference potential, a first amplifier for providing the first reference potential, a second voltage division circuit for providing the second reference potential, and a second amplifier for providing the second reference potential.

5. The A/D converter according to claim 1, wherein:

the reference potential generation circuit includes a voltage division circuit, an amplifier, a first resistor for providing the first reference potential, and a second resistor for providing the second reference potential.

6. The A/D converter according to claim 1, wherein:

the A/D converter is a $\Delta\Sigma$ type A/D converter.

7. The A/D converter according to claim 1, further comprising:

a sub A/D converter placed in parallel with the quantizer and the control circuit, wherein:

the quantizer and the control circuit are configured to generate a high bit digital value; and the sub A/D converter is configured to generate a remaining low bit digital value.

8. The A/D converter according to claim 6, wherein:

a quantization result is fed back a plurality of times per sampling cycle.

* * * * *